United States Patent [19]

Mikata

[11] Patent Number: 5,561,087
[45] Date of Patent: Oct. 1, 1996

[54] METHOD OF FORMING A UNIFORM THIN FILM BY COOLING WAFERS DURING CVD

[75] Inventor: Yuuichi Mikata, Kawasaki, Japan

[73] Assignee: Kabushiki Kaisha Toshiba, Kawasaki, Japan

[21] Appl. No.: 238,900

[22] Filed: May 6, 1994

[30] Foreign Application Priority Data

May 10, 1993 [JP] Japan .................... 5-107899

[51] Int. Cl.$^6$ .................... H01L 21/205; H01L 21/31; H01L 21/3205
[52] U.S. Cl. .................... 437/225; 437/233; 437/235; 437/238; 437/240
[58] Field of Search .................... 437/225, 233, 437/235, 238, 240

[56] References Cited

U.S. PATENT DOCUMENTS

| | | | |
|---|---|---|---|
| 4,113,547 | 9/1978 | Katz et al. | 156/612 |
| 4,544,418 | 10/1985 | Gibbons | 148/1.5 |
| 4,560,420 | 12/1985 | Lord | 148/1.5 |
| 5,270,266 | 12/1993 | Hirano et al. | 437/228 |
| 5,439,850 | 8/1995 | Ozturk et al. | 437/228 |

FOREIGN PATENT DOCUMENTS 62-266831  11/1987  Japan .................... H01L 21/30
4-247623  9/1992  Japan .

OTHER PUBLICATIONS

Wolf, Stanley 'Si Proc For VLSI Era', vol. 2, Lattice Press (1990) p. 396.

Primary Examiner—R. Bruce Breneman
Assistant Examiner—Matthew Whipple
Attorney, Agent, or Firm—Finnegan, Henderson, Farabow, Garrett & Dunner, L.L.P.

[57] ABSTRACT

A plurality of wafers are placed on a boat, and the boat is inserted into a reactor. The reactor is heated by a heater, thereby heating the inserted wafers. Then, air is supplied between the reactor and the heater through the fan nozzles of a fan unit, thereby cooling the heater quickly at a rate of 17° C./min. $PH_3$ and $SiH_4$ gases are introduced into the reactor through first and second gas nozzles, only while the average temperature of a peripheral portion of each wafer remains 30° C. lower than that of a central portion of the same. Thereafter, when the temperature difference between the peripheral and central portions has become lower than 30° C., the supply of $PH_3$ and $SiH_4$ gases is stopped. Thus, a polycrystal silicon film is formed on each wafer.

10 Claims, 6 Drawing Sheets

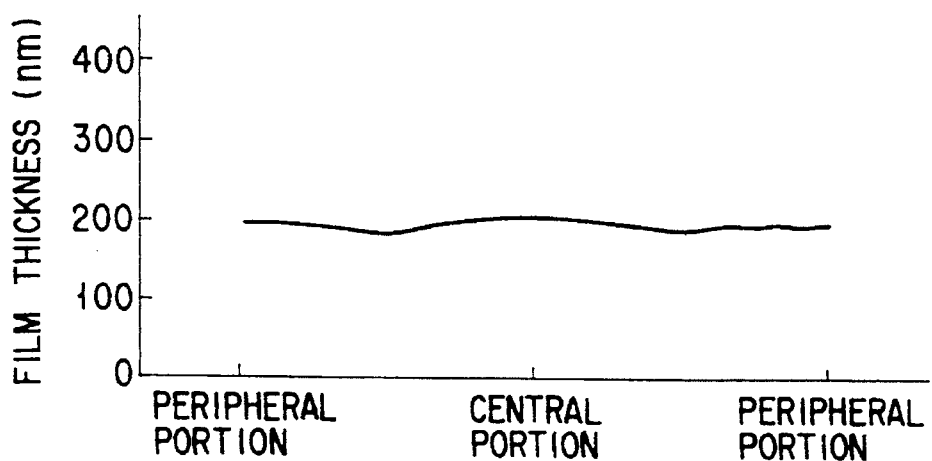
F I G. 3
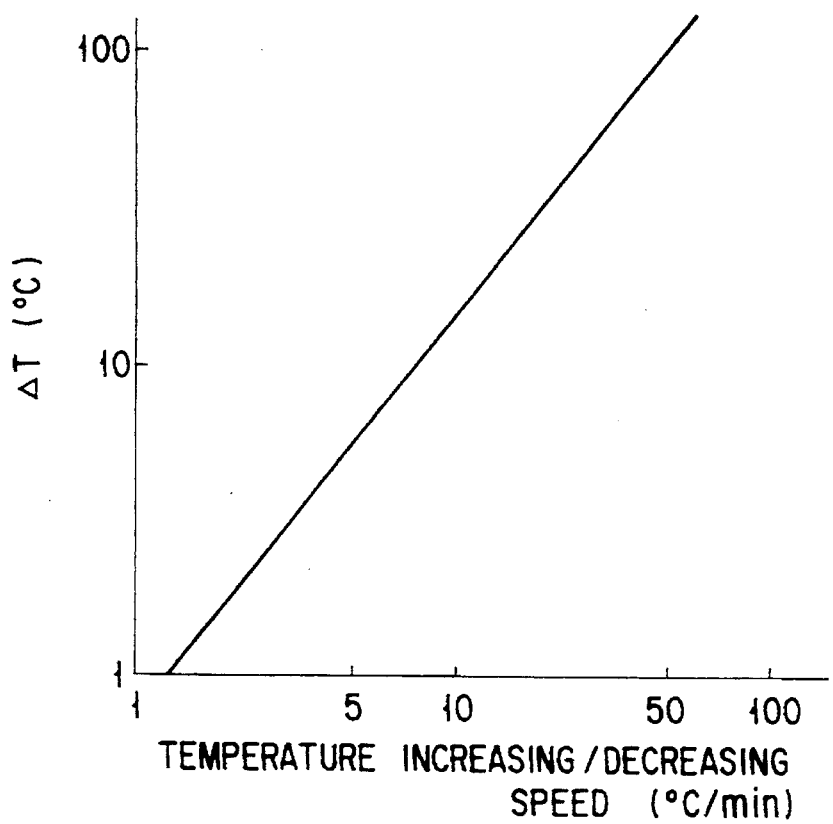
F I G. 4

METHOD OF FORMING A UNIFORM THIN FILM BY COOLING WAFERS DURING CVD

BACKGROUND OF THE INVENTION

1. Field of the Invention

This invention relates to a method for forming a thin film and an apparatus for forming the thin film, and in particular, to a method for forming a thin film of a uniform thickness.

2. Description of the Related Art

FIG. 8 is a cross sectional view, showing a vertical type LPCVD (Low Pressure Chemical Vapor Deposition) reactor which uses a conventional thin-film-forming method. The vertical type LPCVD reactor is used in a process for manufacturing semiconductor devices, to form silicon oxide films, polycrystal silicon films, or the like on a plurality of semiconductor substrates.

As is shown in FIG. 8, a reactor 2, which comprises first and second quartz tubes 3 and 4, is provided inside a cylindrical heater 1. The first quartz tube 3 is located near the, inner wall of the heater 1, having one end sealed and the other end connected to one end of a manifold 5. The other end of the manifold 5 is sealed with a sealing member 6. First and second gas nozzles 7 and 8 and an exhaustion port 9 are located at peripheral portions of the manifold 5. One end of the second quartz tube 4 is located near the inner surface of the manifold 5. The other end of the quartz tube 4 is placed in the vicinity of the sealed end of the first quartz tube 3. Thus, the second quartz tube 4 is set inside the first quartz tube 3.

The first gas nozzle 7 has one end located inside the other end of the second quartz tube 4. A plurality of gas supply ports 7a are formed in the gas nozzle 7, extending toward the axis of the second quartz tube 4. The second gas nozzle 8 has one end located inside the second quartz tube 4 and near the one end thereof.

A heat retaining cylinder 10 is arranged above the sealing unit 6 and inside the second quartz tube 4. A boat 12 for containing a plurality of wafers 11 is located above the heat retaining cylinder 10.

In operation, wafers 11 are placed in the boat 12, which is inserted into the reactor 2. Thereafter, the reactor 2 is heated by the heater 1 to a predetermined temperature. Then, a material gas (not shown) is introduced into the reactor 2 through the first and second gas nozzles 7 and 8, and applied to the wafers 11. The gas flows in the directions of arrows 13. On the wafers 11, the gas is decomposed, forming thin films thereon. During forming the films, the surface temperature of the wafers 11 is kept almost constant to obtain films of a predetermined thickness. Specifically, changes in surface temperature is held at 1° C. or less.

Although in the conventional thin-film-forming method, the surface temperature of the wafers 11 are maintained almost constant to form films of a uniform thickness, uniform films cannot be obtained in some cases.

If, for example, P-doped $SiO_2$ films are formed on the wafers 11 in the vertical type LPCVD reactor shown in FIG. 8, using TEOS (tetraethyl orthosilicate) and $PH_3$ gases as material gases, at an internal reactor temperature of 600° C. and under an internal reactor pressure of 0.5 Torr, the $SiO_2$ films will have the thickness distribution as shown in FIG. 9. As is evident from FIG. 9, each wafer is thicker at the peripheral portion than at the central portion.

Further, if P-doped polycrystal silicon films are formed on the wafers 11 by the vertical type LPCVD reactor, using $SiH_4$ and $PH_3$ gases as material gases, at an internal reactor temperature of 600° C. and under an internal reactor pressure of 0.5 Torr, the polycrystal silicon films will have the thickness distribution as shown in FIG. 10. Obviously, each wafer is thicker at the peripheral portion than at the central portion, as the $SiO_2$ film.

If the thickness of a thin film formed on a wafer is not uniform, wiring contact may fail at a thick portion of the wafer, or the workability of the wafer be reduced. Consequently, a semiconductor device formed on the wafer may have but low operability.

FIG. 11 shows an essential part of a conventional thin-film-forming apparatus. This apparatus differs from the conventional vertical type LPCVD reactor shown in FIG. 8 only in that interrupting flat rings 15 are attached to the boat 12 for enhancing the uniformity of the thickness of a thin film.

Each of the flat rings 15 is interposed between peripheral portions of each adjacent pair of the wafers 11 contained in the boat 12. The rings 15 interrupt the material gases from flowing between the adjacent wafers. This makes it possible to form a thin film of a uniform thickness on each wafer 11.

FIG. 12 shows an essential part of another conventional thin-film-forming apparatus. The apparatus differs from the conventional vertical type LPCVD reactor shown in FIG. 8 only in that interrupting flat disks 16 are attached to the boat 12 for enhancing the uniformity of the thickness of a thin film.

Each wafer 11 is placed on a corresponding one of the flat disks 16 which have a diameter larger than the, wafer 11. A thick film is thereby formed on a peripheral portion of the flat disk 16. As a result, a thin film of a uniform thickness is formed on each wafer 11.

As explained above, a uniform thin film can be formed on each wafer 11 in the conventional thin-film-forming apparatuses. However, the use of the interrupting rings 15 or disks 16 reduces the number of wafers 11 that can be treated at a time, ultimately increasing the manufacturing cost of resultant semiconductor devices. Further, an apparatus provided with such rings or disks is complicated in structure. Inevitably, its manufacturing cost is high, and its maintenance is difficult.

SUMMARY OF THE INVENTION

It is the object of the invention to provide a method for forming thin films of a uniform thickness on a greater number of wafers at a time than the conventional method, reducing the manufacturing cost of resultant semiconductor devices, and an apparatus which uses the thin-film-forming method and can be manufactured at low cost and maintained with ease.

According to a first aspect of the invention, there is provided a method of forming a thin film, comprising the steps of:

inserting semiconductor substrates into a reactor;

heating the reactor to thereby heating the semiconductor substrates to a first temperature; and cooling the semiconductor substrates at a predetermined rate from the first temperature to a second temperature by cooling the reactor, and supplying predetermined gases onto the semiconductor substrates only while a temperature of a peripheral portion of each of the semiconductor substrate remains, during cooling, lower by a third temperature than a temperature of a central portion of the semiconductor substrate.

According to a second aspect of the invention, there is provided an apparatus for forming a thin film, comprising:

a reactor for containing semiconductor substrates;

gas introducing means for introducing gases into the reactor;

heating means located outside the reactor for heating the reactor;

cooling means for cooling the reactor; and control means for controlling the gas introducing means, the cooling means and the heating means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 shows the thickness distribution of peripheral and central portions of a polycrystal silicon film formed on a wafer in the first embodiment of the invention;

FIG. 4 is a graph, showing the relationship between the temperature increasing/decreasing rate of the heater employed in the vertical type LPCVD reactor of FIG. 1, and the difference in the average temperatures of central and peripheral portions of the wafer;

DETAILED DESCRIPTION OF THE PREFERRED EMBODIMENTS

The embodiments of the invention will be explained with reference to the accompanying drawings.

Figure 1:
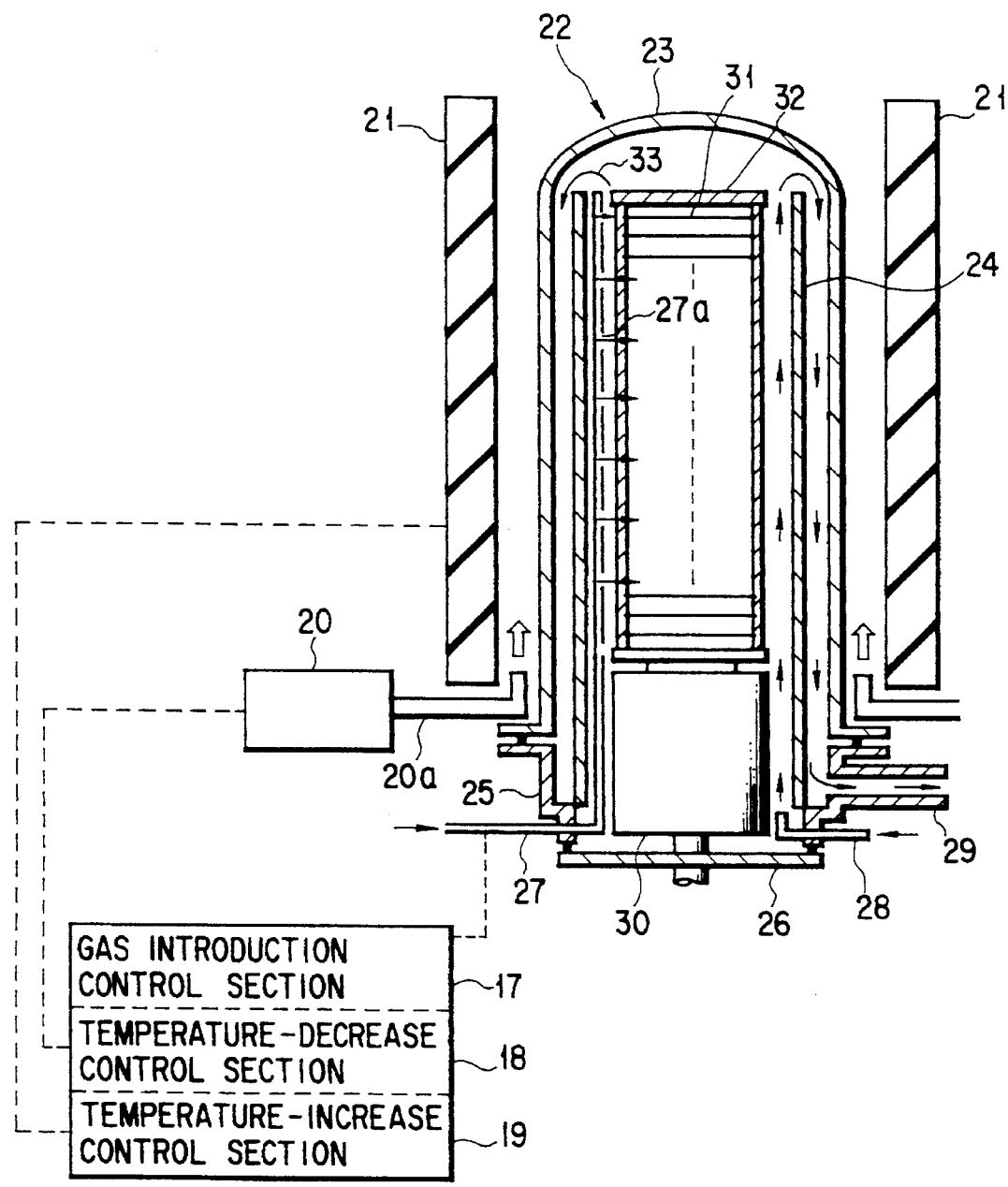
FIG. 1 is a cross sectional view, showing a vertical type LPCVD reactor or thin-film-forming apparatus according to a first or a second embodiment of the invention.

FIG. 1 is a cross sectional view, showing a thin-film-forming apparatus or vertical type LPCVD reactor according to a first embodiment of the invention. A reactor 22 is provided inside a cylindrical heater 21, which can be heated quickly. The heater 21 is controlled by a temperature-increasing section 19. A fan unit 20 is provided in the vicinity of the heater 21 for cooling the same quickly. The fan unit 20 is controlled by a temperature-reducing section 18. The fan unit 20 has a fan nozzle 20a. The tip end of the nozzle 20a is located between the heater 21 and the reactor 22. The reactor 22 comprises first and second quartz tubes 23 and 24.

The first quartz tube 23 is located inside the heater 21, and has one end sealed and the other end connected to one end of a manifold 25. The other end of the manifold 25 is sealed with a sealing unit 26. First and second gas nozzles 27 and 28 and an exhaustion port 29 are provided at peripheral portions of the manifold 25. One end of the second quartz tube 24 is located close to the inner surface of the manifold 25. The other end of the quartz tube 24 is located in the vicinity of the sealed end of the first quartz tube 23. Thus, the second quartz tube 24 is located inside the first quartz tube 23.

The first gas nozzle 27 has one end located inside the other end of the second quartz tube 24. A plurality of gas supply ports 27a are formed in the gas nozzle 27 such that they are opposed to the axis of the second quartz tube 24. The second gas nozzle 28 has one end located inside the second quartz tube 24 in the vicinity of the one end thereof.

A heat retaining cylinder 30 is provided above the sealing unit 26 and inside the second quartz tube 24. A boat 32 for containing a plurality of wafers 31 is provided above the heat retaining cylinder 30.

Figure 2A:
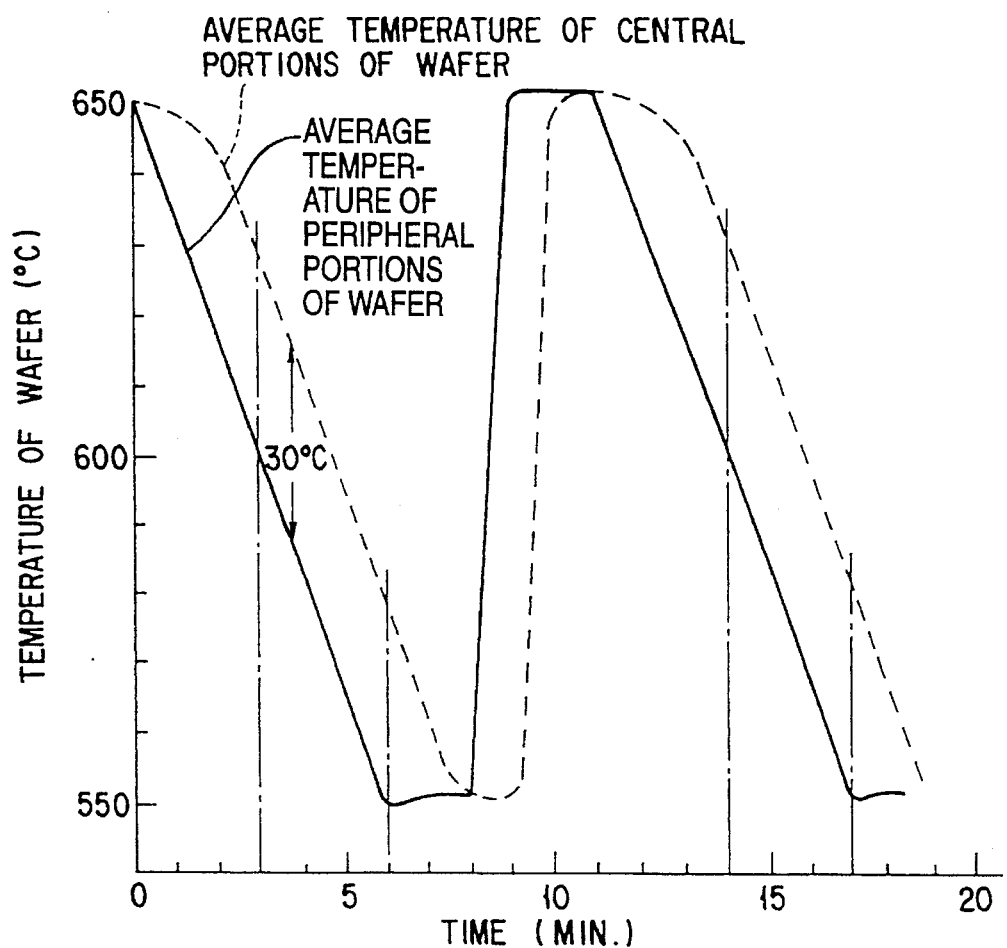
FIG. 2 is a graph, showing the relationship between the temperature of a central portion of a wafer placed in the apparatus of FIG. 1, the temperature of a peripheral portion of the wafer, and the flows and the time periods of material gases applied to the wafer.
Figure 2B:
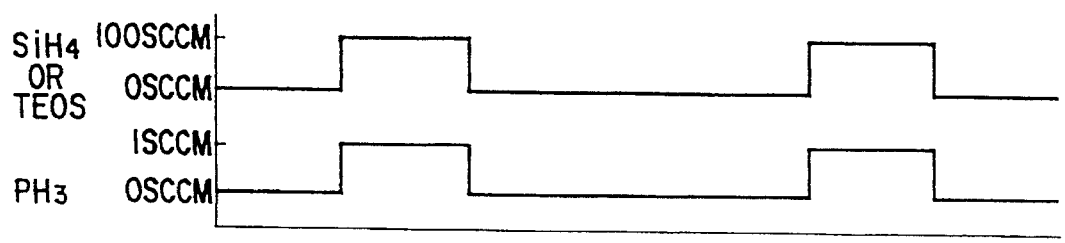

In the boat 32, the wafers 31, each of which has a diameter of 8 inches, are arranged parallel to one another with a pitch of 4 mm. The boat 32 is inserted into the reactor 22 together with the wafers. In the reactor 22, the temperature of each wafer 31 is controlled by the temperature-increasing section 19 and the temperature-reducing section 18, and the flows of material gases and the time point of introduction of the gases are controlled by a gas introducing section 17, as is shown in FIG. 2.

The wafer 31 is heated up to 650° C. by heating the reactor 22 with the use of the heater 21. Then, air is supplied between the heater 21 and the reactor 22 through the fan nozzles 20a of the fan unit 20, to thereby quickly cool them. As a result, the wafer 31 cools to about 550° C. at a rate of 17° C./min. PH$_3$ and SiH$_4$ gases as the material gases are introduced into the reactor 22 through the first and second gas nozzles 27 and 28, only while the average temperature of a peripheral portion of the wafer 31 remains 30° C. lower than that of a central portion of the same. These material gases flow in directions indicated by the arrows, and are decomposed on the wafers 31. The flows of $SiH_4$ and $PH_3$ are set at 100 sccm and 1 sccm, respectively, and the internal pressure of the reactor 22 is set at 0.5 Torr.

When the temperature difference between the central and peripheral portions of the wafer 31 has become smaller than 30° C., the supply of the material gases is stopped. Thereafter, the wafer 31 is again heated to 650° C. at a rate of 100° C./min. Thus, the wafer 31 are repeatedly heated and cooled, and the material gases are repeatedly supplied into the reactor 22. As a result, a P-doped polycrystal silicon film (not shown) is formed on the wafer 31.

FIG. 3 shows the thickness distribution of a polycrystal silicon film formed on the wafer 31 by the above-described method. As is evident from FIG. 3, there is little difference in thickness between central and peripheral portions of the film on the wafer 31. In other words, the film has substantially a uniform thickness.

FIG. 4 shows the relationship between the temperature increasing/decreasing rate of the heater employed in the vertical type LPCVD reactor of FIG. 1, and the difference $\Delta T$ in the average temperatures of central and peripheral portions of the wafer. As is evident from FIG. 4, during increasing the heater temperature, a peripheral portion of the wafer 31 have an average temperature higher than a central portion thereof; whereas during decreasing the heater temperature, the peripheral portion has an average temperature lower than the central portion.

Figure 5:
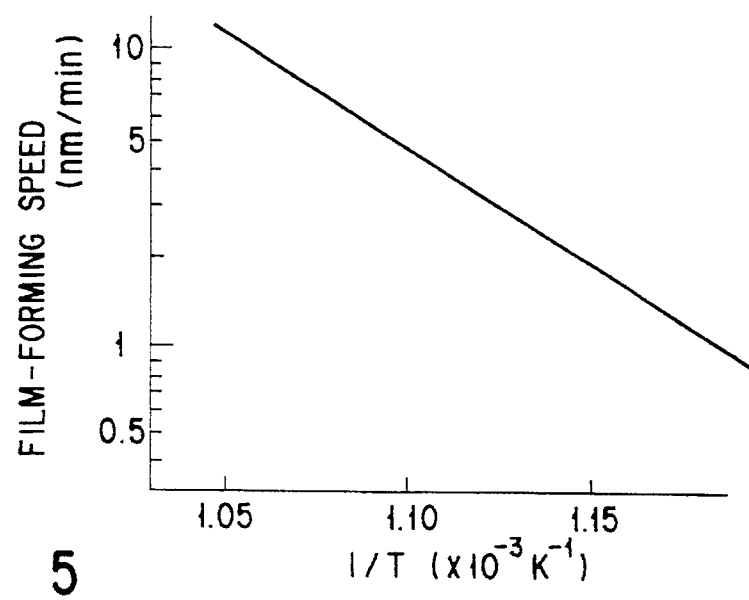
FIG. 5 is a graph, showing the film-forming rate characteristics of a polycrystal silicon film formed on a wafer by the vertical type LPCVD reactor of FIG. 1 under conditions employed in the first embodiment.

FIG. 5 shows the film-forming rate characteristics of a polycrystal silicon film formed on a wafer by the vertical LPCVD reactor under the conditions employed in the first embodiment.

In the above first embodiment, after the wafer 31 is heated to 650° C., it is cooled to about 550° C. at a rate of 17° C./min. During the cooling, the average temperature of a peripheral portion of the wafer 31 is kept 30° C. lower than that of a central portion thereof, as is shown in FIG. 4. Only while the temperature difference remains 30° C., the material gases are supplied into the reactor 22. Since the lower the temperature of the wafer 31, the lower the film-forming rate (see FIG. 5); the film-forming rate of the peripheral portions can be kept lower. In other words, since the average film-forming rate of the peripheral portion is generally higher than that of the central portion as explained with reference to the conventional film-forming method, the both film-forming rates can be made equal to each other by causing the temperature of the peripheral portion to be lower than that of the central portion. Accordingly, a polycrystal silicon film of a uniform thickness can be formed on the wafer 31. As is shown in FIG. 3, the resultant polycrystal silicon film is substantially free from thickness changes in peripheral and central portions of the wafer 31, which means that the thickness of the film is remarkably uniform.

Further, the film-forming apparatus of the invention can provide a film of a highly uniform thickness, although it has a simple structure with no interrupting rings or disks as employed in the conventional film-forming apparatuses. Accordingly, the apparatus of the invention can treat at a time a greater number of films than the conventional ones, with the result that it can provide a wafer at lower cost than the conventional apparatuses. Moreover, the simple structure with no interrupting members enables the apparatus to be produced at low cost, and facilitates the maintenance thereof.

Although in the first embodiment, $PH_3$ and $SiH_4$ gases are used as the material gases to form a polycrystal silicon film on the wafer 31, other material gases may be used to form another film.

In addition, although the wafer 31 is controlled to have different temperatures at its central and peripheral portions while being cooled, so as to form a film of a uniform thickness; the invention can be modified such that the wafer has different temperatures at its central and peripheral portions while being heated, thereby forming a film of a uniform thickness.

The cross sectional view of FIG. 1 can be used to also show a vertical type LPCVD reactor according to a second embodiment. Only elements which differ from those employed in the first embodiment will be explained.

The temperature of the wafer 31 and the flows of material gases are controlled as shown in FIG. 2. Specifically, only while the average temperature of a peripheral portion of the wafer 31 remains 30° C. lower than that of a central portion thereof, $PH_3$ gas containing 10% of He is introduced into the reactor 22 through the first gas nozzle 27, and TEOS gas is introduced into the reactor 22 through the second gas nozzle 28. The flow of each of these gases is set to 100 sccm. As a result, a $SiO_2$ film (not shown) is formed on the wafer 31.

Figure 6:
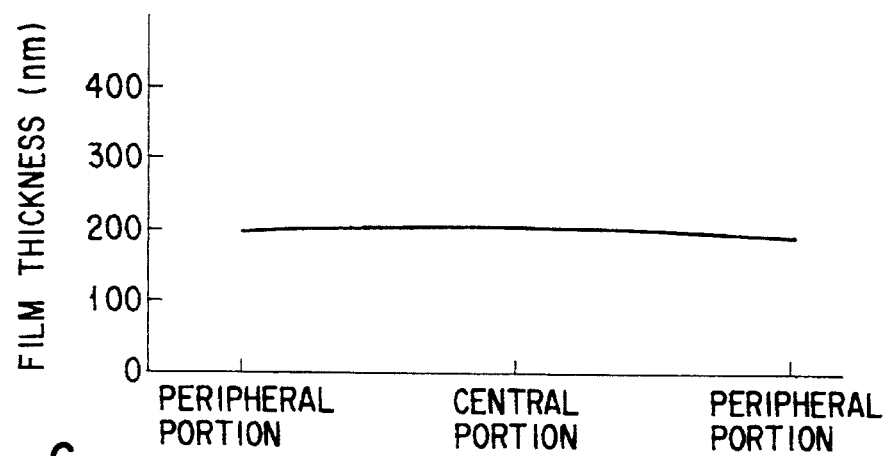
FIG. 6 is a graph, showing the thickness distribution of peripheral and central portions of a polycrystal silicon film formed on a wafer in the second embodiment of the invention.

FIG. 6 shows the thickness distribution of a $SiO_2$ film formed on the wafer 31 by the use of the above method. As is evident from this figure, the film has a more uniform thickness.

Figure 7:
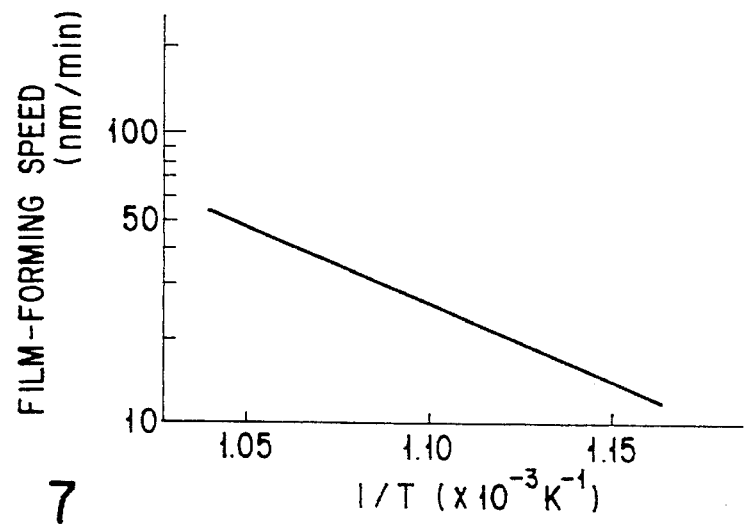
FIG. 7 is a graph, showing the characteristics of the film-forming rate obtained at the time of forming a SiO$_2$ film on a wafer by means of the vertical type LPCVD reactor of FIG. 1 under conditions employed in the second embodiment.
Figure 8:
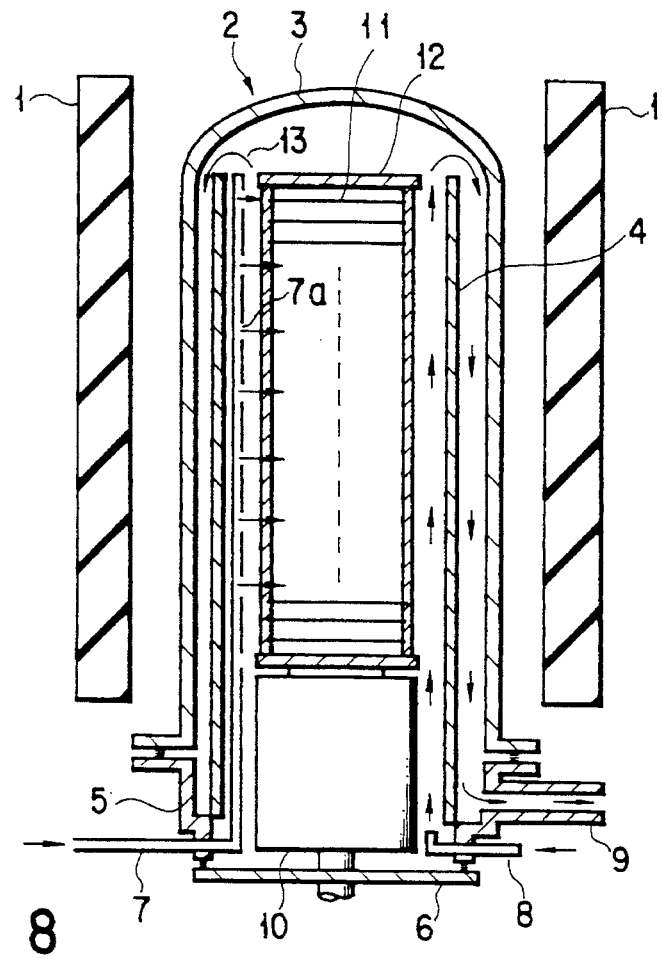
FIG. 8 is a cross sectional view, showing a vertical LPCVD reactor which uses a conventional thin-film-forming method.
Figure 9:
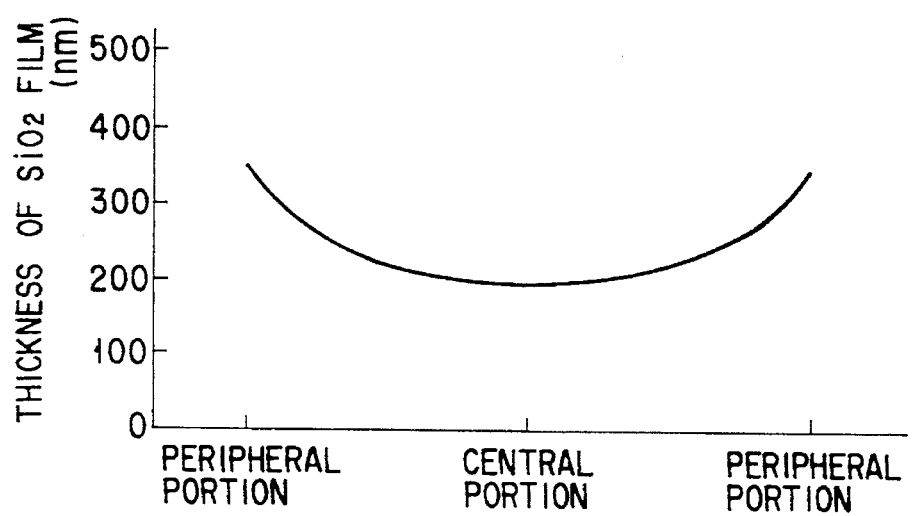
FIG. 9 is a graph, showing the thickness distribution of peripheral and central portions of a SiO$_2$ film formed on a wafer by means of the vertical type LPCVD reactor of FIG. 8.
Figure 10:
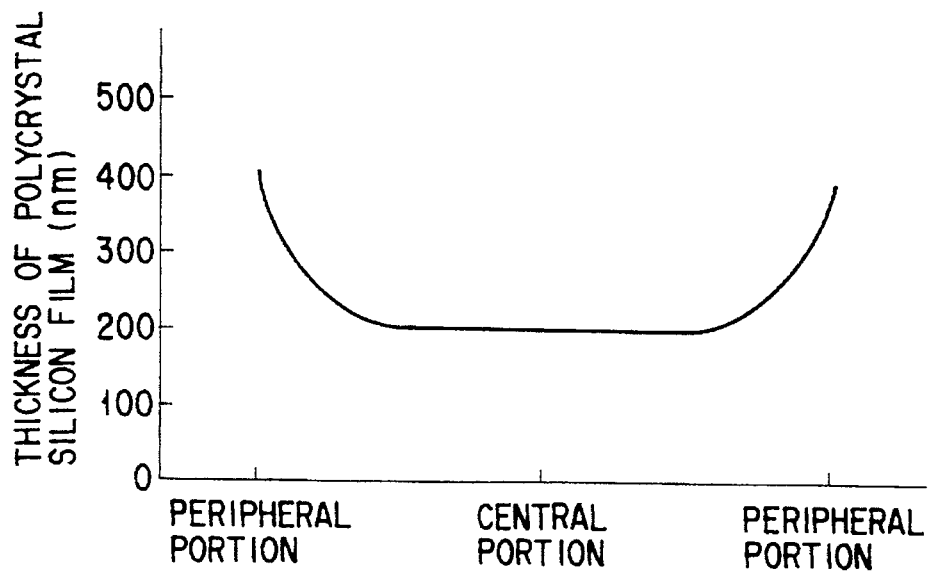
FIG. 10 is a graph, showing the thickness distribution of peripheral and central portions of a polycrystal silicon film formed on a wafer by means of the vertical type LPCVD reactor of FIG. 8.
Figure 11:
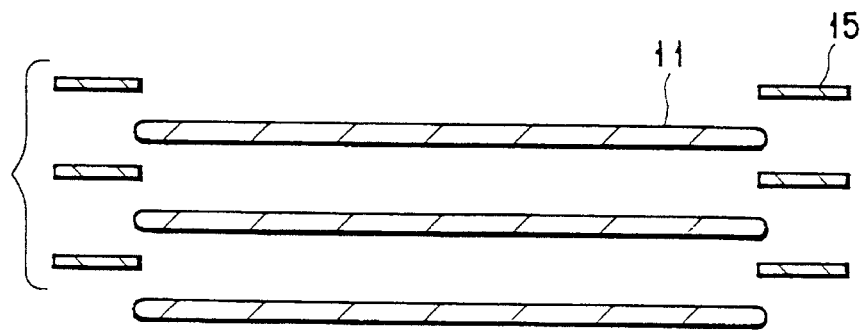
FIG. 11 is a cross sectional view, showing an essential part of another conventional thin-film-forming apparatus.
Figure 12:
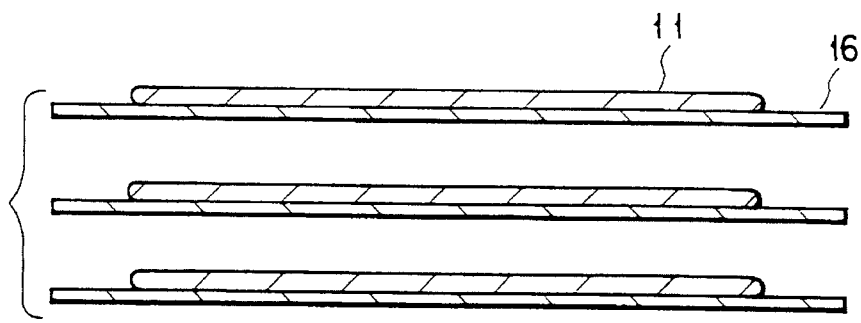
FIG. 12 is a cross sectional view, showing an essential part of a further conventional thin-film-forming apparatus.

FIG. 7 shows the film-forming rate characteristics of a $SiO_2$ film formed on a wafer by the vertical LPCVD reactor of FIG. 1 under the conditions employed in the second embodiment. As is evident from FIG. 7, the lower the temperature of the wafer 31, the lower the film-forming rate.

The second embodiment can provide a similar advantage to that of the first embodiment.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of forming a thin film by a chemical vapor deposition (CVD) process, comprising the steps of:

supplying material gases for forming the thin film on semiconductor substrates by the CVD process, onto wafers while there remains a difference in temperature between central and peripheral portions of each of the wafers in order to form a uniform thickness.

2. A method of forming a thin film by a chemical vapor deposition (CVD) process, comprising the steps of:

inserting semiconductor substrates into a reactor;

heating the reactor to thereby cause the semiconductor substrates to be heated to a first temperature; and cooling the semiconductor substrates from the first temperature to a second temperature by cooling the reactor, and supplying material gases for forming the thin film on the semiconductor substrates by the CVD process onto the semiconductor substrates only while a temperature of a peripheral portion of each of the semiconductor substrates remains, during cooling, lower by a first temperature difference than a temperature of a central portion of each of the semiconductor substrates.

3. The method according to claim 2, wherein the first temperature is 650° C.

4. The method according to claim 2, wherein the second temperature is 550° C.

5. The method according to claim 2, wherein the first temperature difference is 30° C.

6. The method according to claim 2, wherein the cooling step is done at a rate of 17 ° C./min.

7. The method according to claim 2, wherein the material gases are $PH_3$ and $SiH_4$ gases.

8. The method according to claim 2, wherein the material gases are $PH_3$ and TEOS gases.

9. A method of forming a thin film by a chemical vapor deposition (CVD) process, comprising the steps of:

inserting semiconductor substrates into a reactor;

heating the reactor to thereby cause the semiconductor substrates to be heated to 650° C.; and cooling the semiconductor substrates at a rate of 17° C./min. from 650° C. to 550° C. by cooling the reactor, and supplying material gases for forming the thin film on semiconductor substrates by the CVD process, onto the semiconductor substrates only while a temperature of a peripheral portion of each of the semiconductor substrates remains, during cooling, 30° C. lower than the temperature of a central portion of each of the semiconductor substrates.

10. A method of forming a thin film on a semiconductor substrate, comprising the steps of:

heating the semiconductor substrate to a first temperature;

cooling the semiconductor substrate to a second temperature;

controlling the cooling step to create a temperature differential between peripheral portions of the semiconductor substrate and a central portion of the semiconductor substrate for a time interval; and exposing the semiconductor substrate to material gases for forming the thin film on the semiconductor substrate only during the time interval in order to form a film of uniform thickness.

* * * * *

UNITED STATES PATENT AND TRADEMARK OFFICE
CERTIFICATE OF CORRECTION

PATENT NO. : 5,561,087
DATED : October 01, 1996
INVENTOR(S) : Yuuichi MIKATA

It is certified that error appears in the above-indentified patent and that said Letters Patent is hereby corrected as shown below:

Claim 1, column 6, line 48, after "wafers" insert --in order to form a uniform thickness--.

Claim 2, column 6, line 58, after "process" insert --,--.

Claim 7, column 7, line 6, change "$Sill_4$" to --$SiH_4$--.

Signed and Sealed this

Thirtieth Day of September, 1997

BRUCE LEHMAN

Attest:

Attesting Officer

Commissioner of Patents and Trademarks